United States Patent [19]

Greene

[11] Patent Number: 5,204,681

[45] Date of Patent: Apr. 20, 1993

[54] RADIO FREQUENCY AUTOMATIC IDENTIFICATION SYSTEM

[75] Inventor: Morton Greene, Arlington, Va.

[73] Assignee: Gordian Holding Corporation, Dover, Del.

[21] Appl. No.: 765,925

[22] Filed: Sep. 24, 1991

[51] Int. Cl.⁵ ............................................. G01S 13/80
[52] U.S. Cl. ..................................................... 342/51
[58] Field of Search ............................ 342/42, 44, 51

[56] References Cited

U.S. PATENT DOCUMENTS 3,774,205 11/1973 Smith et al. ............................ 342/44
4,209,783 6/1980 Ohyama et al. ................... 342/44 X
4,292,636 9/1981 Egger et al. ........................... 342/44

Primary Examiner—T. H. Tubbesing
Attorney, Agent, or Firm—Reed Smith Shaw & McClay

[57] ABSTRACT

A radio frequency automatic identification system detects targets which include solid resonators resonating at several frequencies, attributing information to the frequencies at which the target resonates. Preferred resonators are quartz crystals, which may be made by a process of heating quartz to soften it and cutting crystals to approximate size and resonant frequency. Resonators produced by such a process are measured to determine their actual resonant frequency, and preferably the crystals are sorted into predetermined frequency windows in accordance with their measured resonant frequency. A set of resonators having frequencies corresponding to predetermined data is selected from the sorted groups of resonators and incorporated into a target. The preferred target is an ink-like material having a plurality of resonators disposed in a matrix which is radio frequency transparent at the frequency of interest. Targets are preferably detected by repetitively sweeping the frequency of the interrogating signal through a range which includes the information-bearing range of the system.

17 Claims, 3 Drawing Sheets

RADIO FREQUENCY AUTOMATIC IDENTIFICATION SYSTEM

FIELD OF THE INVENTION

This invention relates to automatic identification of items using radio frequency signals. More particularly, this invention relates to production of radio frequency responsive materials for use in such a system; to radio frequency responsive targets using such materials; and to systems for automatic radio frequency identification of items by such targets.

BACKGROUND OF THE INVENTION

Automatic identification systems are widely used to input data into computer systems and to control operation of equipment. Radio frequency operated systems are often used in automatic identification applications where identification of an object is to be made without contact and where the application may not permit line-of-sight communication between the object and a sensor. Radio frequency automatic identification ("RF/AID") systems are based on "targets" which generally function as transponders. Upon receipt of a radio frequency interrogating signal, the target responds by producing a detectable radio frequency response signal. Such targets have taken the form of tags or labels which are affixed to an object to be identified. As used herein, a "target" is any radio frequency responsive means which may be attached to, printed upon, or otherwise associated with an object to be identified.

Automatic identification systems are presently used or contemplated for use in a wide variety of applications for monitoring of people, animals, locations, and things. Such applications include material handling, such as automatic storage and retrieval; cargo handling, such as baggage sorting and tracking; asset management, such as of rental vehicles or for retail theft control; identification of persons, such as for facility access control or patient tracking; and identification of animals, such as for automatic feeding.

One major attribute of presently available RF/AID systems which limits their use is that the target cost is substantial. The cheapest currently available radio frequency responsive targets cost on the order of $10 per target, and many cost on the order of $100 per target. This high cost substantially restricts use of such systems to situations where the target can be reused, such as in retail theft prevention where targets are removed from an item after purchase and reused on other items. Another attribute which restricts use of present RF/AID systems is the target size. Targets are typically several inches long, which inhibits their use where small items are to be identified or where it is desired that the target be unobtrusive.

Both of these attributes result in large part from the structure typically employed for RF/AID targets and the frequency at which they operate. Such targets typically contain an antenna for receiving an interrogating RF signal; radio frequency processing means for determining whether an interrogating signal has been received; and radio frequency transmitting means responsive to the processing means for transmitting a detectable RF response signal from the target. Present systems typically operate at fairly low frequencies.

The present invention is directed to a new system for RF/AID which avoids the foregoing drawbacks.

SUMMARY OF THE INVENTION

The present invention comprises several aspects which are useful together to provide a new system for automatic identification.

In a first aspect of the invention, a radio frequency target includes a plurality of resonant articles, resonating at a plurality of radio frequencies. The resonant frequencies of the articles are used to provide identification data. In a preferred embodiment of the first aspect of the invention, the resonant articles are passive solid state resonators. In a particularly preferred embodiment, the articles are materials in the quartz family, such as quartz crystals, which may be fabricated having various desired properties and shapes.

In a second aspect of the invention, a method of making a target having resonant articles to provide identification data includes the step of measuring the resonant frequencies of the resonant articles. In a particularly preferred embodiment of the second aspect of the invention, resonant articles for use in a particular target are selected according to their resonant frequency as previously measured.

In a third aspect of the invention, items are identified by transmitting radio frequency interrogating signals into a target field and evaluating the response of the target field to determine whether the field contains resonant articles. In a preferred embodiment of the third aspect of the invention, the frequency of the interrogating signal is varied so as to determine the response of the target field to different frequencies. In a particular preferred embodiment of the third aspect of the invention, the presence or identity of a target in the target field is evaluated according to the frequencies at which the target field response indicates the presence within the field of resonant articles.

Other aspects of the invention will become apparent upon review of the following specification and the drawings.

DETAILED DESCRIPTION

The system of the present invention provides automatic item identification in a manner which, like existing RF/AID systems, is free from the constraints of line-of-sight detection imposed by barcode systems and short range detection imposed by magnetic encoding systems. Unlike existing RF/AID systems, the system of the present invention is operable with inexpensive targets which may be of small size and large information density. The system is operable at great distances as well as in confined areas. The information-containing components of the invention may be fashioned into targets which are easily applied to a wide variety of items to be identified. Such items may be reliably identified using versatile, low-cost interrogating systems.

Figure 1:
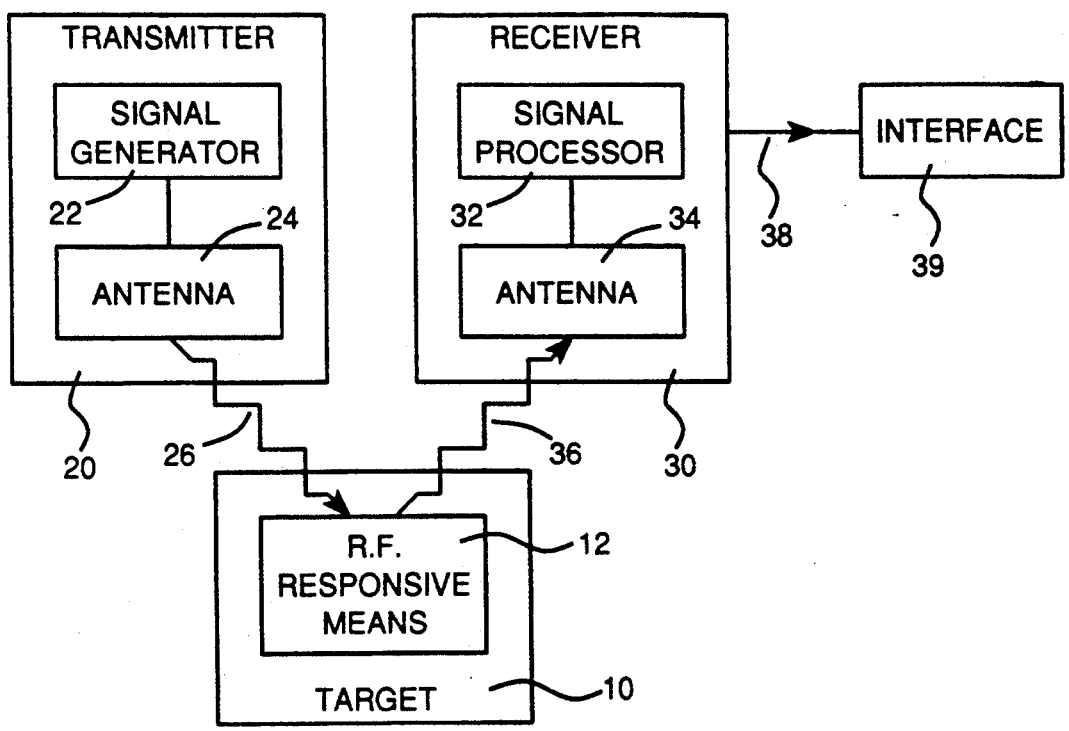
FIG. 1 is a block diagram generally illustrating the functional elements of an RF/AID system.

FIG. 1 generally illustrates the functional elements of an RF/AID system. The system includes a target 10 which includes and serves as a carrier for radio frequency responsive means 12. Such a target 10 may be affixed to or incorporated in an item to enable it to be detected and/or identified by a system, often referred to as a scanner or reader, which includes a radio frequency transmitter 20 and a radio frequency receiver 30. Transmitter 20 includes a signal generator 22 coupled to an antenna 24 for generating radio frequency interrogating signals 26 in a desired target field. Receiver 30 receives radio frequency response signals 36 at antenna 34 coupled to signal processor 32. Signal processor 32 produces an output 38 indicative of the presence of a target 10 within the target field in response to the response signals 36 received by antenna 34. Output 38 may be supplied to a computer or other identification information processing system 39. Transmitter 20 and receiver 30 may be physically associated in a single unit, and the functions of antennas 24 and 34 may be performed by a single antenna.

Figure 2:
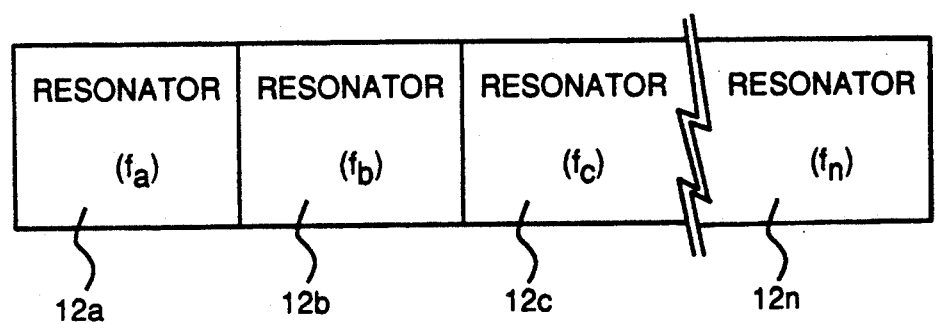
FIG. 2 is a block diagram illustrating in greater detail the radio frequency responsive means shown in FIG. 1.

FIG. 2 functionally illustrates in greater detail the preferred radio frequency responsive means 12 shown in FIG. 1. Responsive means 12 includes a plurality of devices which are resonant at radio frequency. FIG. 2 shows resonant means or resonators $12a$, $12b$, $12c$ ... $12n$ which are resonant at frequencies $f_a$, $f_b$, $f_c$ ... $f_n$. These frequencies represent a subset of possible resonant frequencies which may be provided by resonators in target 10, and the particular frequencies present provide the target with identification data.

Figure 3:
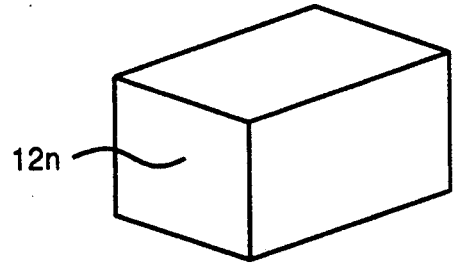
FIG. 3 illustrates a preferred radio frequency responsive means.

FIG. 3 illustrates a preferred embodiment of a resonator $12n$. The resonator comprises a piece of solid material having dimensions, electromagnetic properties, and/or mechanical properties rendering it resonant at radio frequency. Although depicted as a rectangular prism, it will be understood that a large variety of shapes may be used in devices having suitable radio frequency response characteristics.

The preferred resonator $12n$ is a quartz crystal. Such crystals have electrical and mechanical properties which enable them to be used as accurate, rugged, reliable, and stable frequency determining elements. While a resonator suitable for use in the present invention may consist merely of a quartz crystal, it may be desirable to tailor its properties for particular applications by modifying it to alter its characteristics such as by improving its Q. For instance, it may be desirable to dope the quartz with another material, such as gallium. It may also be desirable to couple the crystal to auxiliary structures such as metallizations forming antennas to improve coupling of incident radio frequency energy to the crystal or to control the mode of operation of the crystal, for instance such as is done in a surface acoustic wave device. Although quartz crystals are preferred resonators, useful solid resonators may no doubt be made from other crystalline materials or from non-crystalline solids.

Such a resonator $12n$ may be resonant at several frequencies and may be structured so that several such frequencies are used to provide identification information in a target. At any rate, the resonator is configured so that it resonates at least at one resonant frequency which is an information-carrying frequency in the system.

While a variety of frequency ranges may be used in systems according to the present invention, high frequencies are believed preferable for a variety of reasons including availability for use, size of resonator required, identification range, and ability to control the interrogating signal. Thus, for instance, frequencies in excess of about 1 GHz are preferred, particularly frequencies in excess of about 10 GHz. Frequencies may be used up to and even above 500 GHz, near visible light frequency.

Figure 4:
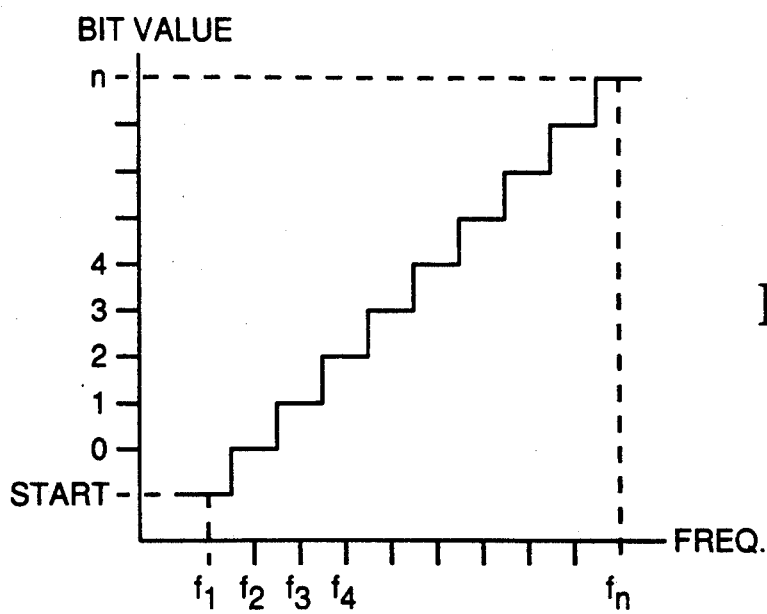
FIG. 4 is a graph illustrating a method whereby numerical data may be attributed to frequency.

FIG. 4 illustrates generally how identification information is provided in accordance with the present invention. FIG. 4 is a graph of attributed numerical value versus frequency. The frequency domain is divided up into a plurality of bands or "windows", each representing a binary digit or bit value. Thus an n-bit number requires n distinguishable frequency bands. One or more "start" bits may be required in a target. Thus, for instance, an identification band of 60.0-60.1 GHz may be partitioned into 10 windows each of which is 10 MHz wide including any "stop" bands between adjacent windows which may be desired. These windows may be defined in the system to represent a start bit and a 9-bit data word. In the terms of FIG. 2, any resonators 12 present would be required to fall into one of the 10 frequency windows defined in the system of this example, and 10 resonators would be required to provide a target with a start bit and all 9 available data bits.

Referring to FIG. 3, it is noted that although one such solid resonator is necessary and sufficient to provide one bit of information by resonance, it may be desirable to use a number, perhaps even a very large number, of individual resonators such as crystals to form each identifying resonant means of FIG. 2. Increasing the number of individual resonators can provide a cheap and reliable way of increasing the target's responsiveness to a given intensity of interrogating signal at the target. Thus, a large number of crystals each having a frequency in a certain window will enable the presence of the corresponding data bit in the target to be detected at long range, with low power interrogation, and/or with a low gain receiver, any of which may be highly desirable in a given application.

An important part of the present invention lies in the ability to provide resonant devices for use in targets which are cheap, accurate, and stable. As noted above, the preferred resonant devices are quartz crystals forming solid state passive resonators. Although quartz crystals are currently produced in large numbers for use in frequency determining applications, existing techniques for production would probably be too expensive for economical use in the RF/AID system of the present invention. Such crystals presently are carefully cut to precise dimensions to produce products meeting very tight frequency tolerance requirements.

To avoid the limitations of existing production techniques, so as to provide a method for inexpensively producing crystals in large numbers for use in the system of the present invention, a novel method for manufacturing is provided, comprising generally two parts. The first part is a method of inexpensively producing solid resonators such as quartz crystals in large numbers, with each resonator having resonant characteristics reasonably likely to fall within the system's identification band. The second part is determining the resonant characteristics of individual resonators by measuring their as-produced characteristics.

The preferred method of providing solid resonators is to fabricate resonators of a solid material in approximately desired size and to select resonators according to their measured resonant characteristics. Applicant believes that the following method would satisfy the requirements of the invention.

When quartz is heated sufficiently, it softens somewhat prior to liquefying. It is believed that such heated softened quartz may be easily cut and/or molded into dimensions and shapes suitable for use as radio frequency resonators. Thus, it is believed that a mass of quartz may be softened by heating, passed through a forming die in a process in the nature of extrusion, and cut into individual crystals, which are then cooled, such as by quenching. Quenching may be performed by immersion in a liquid such as water, oil, petroleum based liquids, or other hydrogen, oxygen, or carbon based liquid. Crystals so produced may then be collected for further processing.

Other methods of providing a number of crystals or other resonators having approximately proper characteristics may no doubt be provided.

Figure 5:
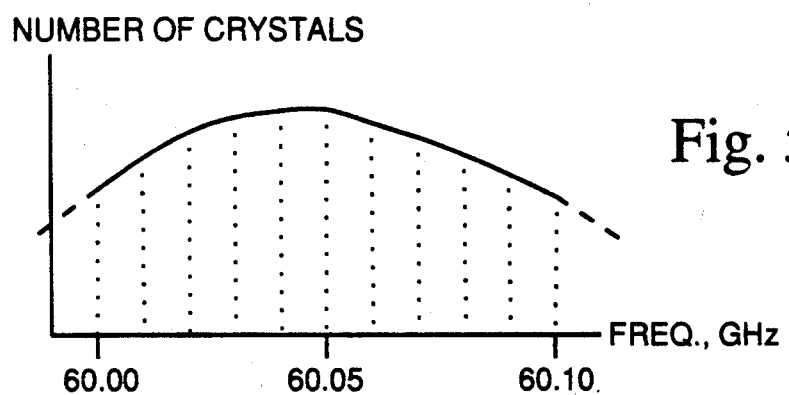
FIG. 5 is a graph showing a distribution of resonant frequencies in a process for producing resonators.

Desirably, the process used for manufacturing resonators of approximately correct resonant characteristics would produce a distribution of characteristics exactly corresponding to the need for resonators in each window. More likely, a manufacturing process will produce resonators with another distribution, such as a normal distribution of resonator frequencies. Such a distribution desirably substantially coincides with the range for a particular identification band or bands to be used for RF/AID. For instance, FIG. 5 shows an approximately normal distribution centered around 60.05 GHz, which might be produced in a process to make resonators in approximately equal numbers in each window of the 60.0–60.1 GHz band described with respect to FIG. 4.

Figure 6:
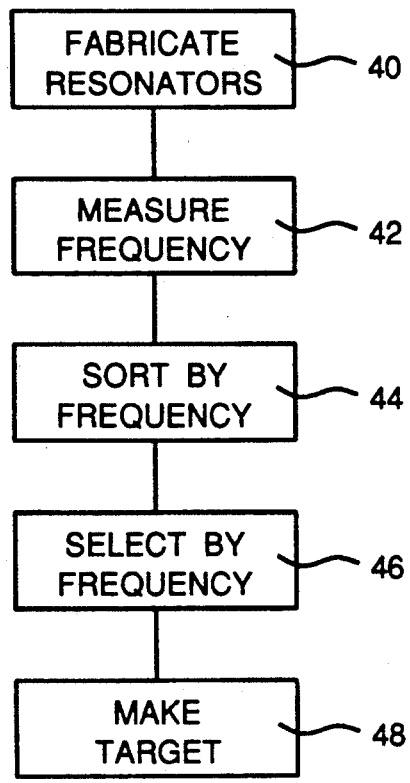
FIG. 6 is a flow diagram of a process for producing targets in accordance with the invention.
Figure 7:
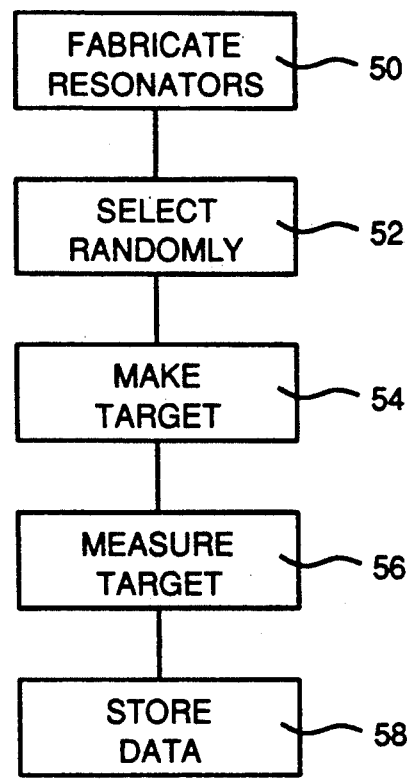
FIG. 7 is a flow diagram of another process for producing targets in accordance with the invention.

Once a process is developed for producing resonators differing in characteristics, resonators so produced may be fabricated into information-carrying targets. FIGS. 6 and 7 show two methods for producing targets which are identifiable by frequency for use in RF/AID systems.

FIG. 6 is the presently preferred method for producing such targets. In step 40, a set of resonators is produced by a process or processes designed to yield resonators having differing resonant frequencies approximating a desired value. The frequency of each resonator is measured in step 42, and in step 44 the resonators are sorted by frequency in accordance with the measurement made in step 42. For instance, quartz crystal resonators may be fabricated as described above, conveyed to a measuring system which may be similar to the system in FIG. 1, and each crystal sorted by identifiably marking it or preferably by segregating it with other crystals of the same or similar frequency. Thus, with reference to FIG. 4 and 5, upon completion of sorting step 44, one might have 10 containers, each of which contains crystals from only one frequency window representing only one bit of information. A set of crystals having frequencies which represent the bits of an identifying digital word are selected in step 46, and a target is made using the selected crystals in step 48. The method of FIG. 6 permits one to make a target containing predetermined identifying data.

In contrast, FIG. 7 shows a method for making targets which contain random or uncontrolled identifying data rather than predetermined identifying data. After fabrication of resonators having differing frequencies in step 50, a set of resonators is randomly selected in step 52 and incorporated into a target in step 54. A measurement is made in step 56 to determine the frequencies of the resonators which were incorporated into the target. Measured data is stored in step 58 so that the target can be identified as valid when it is interrogated in actual use.

Figure 8:
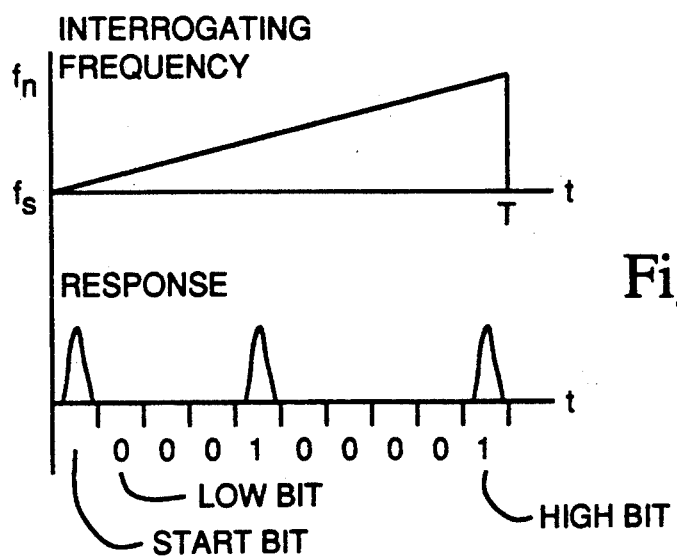
FIG. 8 is a graphical illustration of a preferred method of radio frequency signal generation and processing.

FIG. 8 illustrates a preferred method of generating and processing radio frequency signals in accordance with the present invention. In accordance with this method, the target field is interrogated for possible resonant articles by varying the transmitted frequency in a range which includes the applicable information-bearing band of the system.

FIG. 8 is a pair of graphs, the top showing interrogating signal frequency with respect to time and the bottom illustrating a possible RF response from the target field over the same time interval. As shown in the top graph, the frequency of interrogating signal is varied from a lower limit to an upper limit, which are designated $f_s$ and $f_n$ to correspond with FIG. 4. After reaching the upper frequency $f_n$ at time T, the variation may be repeated starting again at $f_s$, either immediately or after delay period. Desirably and as shown the frequency sweep is substantially linear and continuous, but other predetermined variations may be used. The lower graph of FIG. 8 illustrates a response signal which might be produced by the target field and detected in signal processor 32. This signal shows differences from the background signal, which are illustrated as spikes but might take a variety of forms. The lower graph illustrates a significant feature of the swept-frequency measurement, namely that identifying data may be easily detected by measuring the time at which the spikes or other resonant effects occur in the response.

In the terms of the FIG. 4, if the frequency band is partitioned into 10 windows, with the low frequency window representing a start bit and 9 data bits ranging from a low order bit at $f_1$ to a high order bit at $f_9$, the data word represented by the response in FIG. 8 is 100001000. Such a serial data structure can be easily and inexpensively evaluated. The expense of detection equipment may be reduced by use of a start bit frequency as described or other data structure which similarly permits evaluation by relative rather than absolute frequency determination. This avoids the difficulty and expense of making high resolution, high precision frequency measurements at high frequencies.

The lower graph of FIG. 8 shows a response signal with identification information present in the form of spikes having greater amplitude than the received signal at other frequencies. It should be noted that the response signal may provide troughs or notches at particular frequencies, such as where the resonator absorbs energy at the resonant frequency. All that is required is that the resonator provide a detectable difference in response signal at an identifiable frequency whether the response is greater or less than at other frequencies.

It should be noted that low average power levels can be maintained while using larger measuring signals by transmitting a high power interrogating signal with a small duty cycle. For instance, an interrogating signal which is swept from the low frequency to the high frequency in a 1 millisecond interval and then turned off for 9 milliseconds, to yield a 10% duty cycle, will increase by a factor of 10 the response signal level available from a given average transmitted power level.

Against the forgoing background, it is seen that the present invention is applicable to a wide range of target and identification applications. For instance, the resonators may be extremely small, on the order of the wavelength of the interrogating signal. Resonators of one-quarter wave dimensions at frequencies on the order of 10–100 GHz are quite small, and large numbers of them may be used to provide high density identifying data, far greater than the 9 bits used as illustrations in connection with the above descriptions of drawing figures. A particularly desirable mode of application of an identifying set of resonators is in a matrix of adherent radio frequency transparent material, forming an encoded "ink". Such an ink may be applied to a wide variety of types of materials to target them for identification. One application which deserves particular mention is in identifying documents. An ink comprising radio frequency resonators may be applied to a wide variety of documents to tag or identify them. Applications range from substitutes for barcodes or printed indicia, such as on checks and currency, to inclusion in toner to permit monitoring and/or identification of xerographically copied documents, laser-printed documents, or other documents whether printed by thermal set techniques or otherwise. Crystals or sets of identifying crystals may also be microencapsulated, or included in the bulk of a material to be identified.

Figure 9:
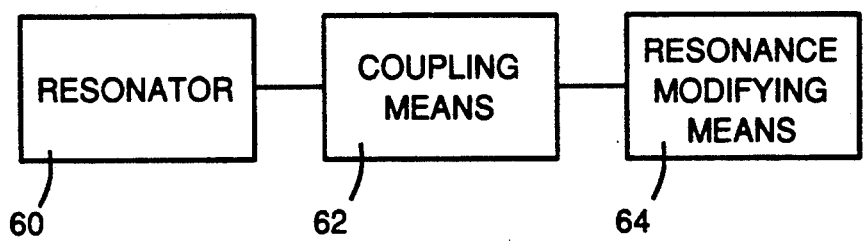
FIG. 9 is a block diagram illustrating a resonator whose resonant characteristics may be altered to alter information in a target.

Another application area which deserves particular mention is modification of target response characteristics. This is done in the prior art, for instance in deactivation of retail theft control tags and labels. The system of the present invention likewise permits modification of target response characteristics, for instance to deactivate a target or otherwise alter the information it contains. A system for modifying target response characteristics is shown in FIG. 9. A resonator 60 is coupled to a resonance characteristic modifying means 64 by a coupling means 62 which may be altered by external influences to vary the coupling between the resonator and the resonance modifying means. Upon application of the appropriate stimulus to the coupling means 62, the resonance characteristics of the entire system of FIG. 9 are altered to change the information provided. One or more such systems may be included in a target to provide the capability of changing the target information.

One possible example of a system according to FIG. 9 is a quartz crystal which is microencapsulated in a heat-deformable medium functioning both as a coupling means and a resonance altering means. At low RF power levels, the mechanical coupling between the encapsulation and the resonator affects the natural resonance characteristics of the resonator. Application of RF power levels sufficiently high to generate heat due to movement of the resonator can result in deformation of the encapsulation medium and thereby change the coupling and resulting effects of the encapsulation medium on resonance characteristics. This change can be interpreted as a change in information. Another example of an alterable resonator is a pair of crystal resonators which are mechanically coupled by a heat deformable medium. When united, the resonators together provide a first resonant frequency. When high power levels are applied at resonant frequency, resulting heat can deform the coupling medium and permit the component resonators each to resonate at their own resonant frequencies, thus providing a change in information contained in a target.

While particular embodiments of the invention have been described, variations will no doubt occur to those skilled in the art without departing from the spirit and scope of the invention.

What is claimed is:

1. A target for use in an automatic identification system comprising a plurality of independent solid bulk resonators, the resonators in said target resonating at a plurality of radio frequencies.

2. A target according to claim 1, wherein each of said resonators comprises means which are resonant at a frequency within one range of a set of predetermined frequency ranges, each such frequency range representing one bit of identifying information, and wherein at least two of said resonators are resonant at frequencies within one of said frequency ranges.

3. A target according to claim 2, wherein said resonators comprise crystals.

4. A target according to claim 3, where said crystals are quartz crystals.

5. A target according to claim 2, wherein said resonators are resonant at radio frequencies greater than about 1 GHz.

6. A target according to claim 2, wherein said resonators are resonant at radio frequencies greater than about 10 GHz.

7. A method of making a target for use in a radio frequency automatic identification system comprising the steps of:
   a. providing resonators, having differing resonant frequencies;
   b. measuring the resonant frequencies of the resonators provided in step a;
   c. selecting a set of said resonators measured in step b; and
   d. making a target comprising said selected set of measured resonators.

8. A method according to claim 7, further comprising the step of sorting resonators according to their resonant frequency measured in step b. into groups, each group having resonators with resonant frequencies falling within one range of a set of predetermined frequency ranges.

9. A method according to claim 8, wherein said selecting step includes selecting members of said groups in accordance with a predetermined system of correlating the frequency range of each said groups with one bit of identifying data.

10. A method according to claim 9, wherein said selecting step includes selecting at least two resonators from one of said groups.

11. A method according to claim 10, wherein said selecting step includes selecting at least two resonators from each of said groups from which resonators are selected.

12. A method according to claim 8, wherein said providing step includes fabricating resonators having resonant frequencies in a distribution which includes a plurality of said frequency ranges.

13. A method according to claim 7, wherein said providing step includes providing passive solid state bulk resonators.

14. A method according to claim 13, wherein said providing step includes providing radio frequency resonant crystals.

15. A method according to claim 7, wherein said target making step includes making a target in which said resonators are independent.

16. A target for use in radio frequency automatic identification systems comprising a plurality of solid state resonators, having differing resonant frequencies, disposed in an adherent matrix of radio frequency transparent material to form an ink.

17. A target according to claim 16, wherein said solid state resonators comprise quartz crystals.

* * * * *